(12) United States Patent
Visconti et al.

(10) Patent No.: US 11,908,506 B2
(45) Date of Patent: *Feb. 20, 2024

(54) MEMORY CELL BIASING TECHNIQUES

(71) Applicant: Micron Technology, Inc., Boise, ID (US)

(72) Inventors: Angelo Visconti, Appiano Gentile (IT); Giorgio Servalli, Fara Gera d'Adda (IT); Andrea Locatelli, Dalmine (IT)

(73) Assignee: Micron Technology, Inc., Boise, ID (US)

( * ) Notice: Subject to any disclaimer, the term of this patent is extended or adjusted under 35 U.S.C. 154(b) by 95 days.

This patent is subject to a terminal disclaimer.

(21) Appl. No.: 17/196,661

(22) Filed: Mar. 9, 2021

(65) Prior Publication Data

US 2021/0264961 A1     Aug. 26, 2021

Related U.S. Application Data

(63) Continuation of application No. 16/441,763, filed on Jun. 14, 2019, now Pat. No. 10,964,372.

(51) Int. Cl.
*G11C 11/22* (2006.01)
*G06F 3/06* (2006.01)

(52) U.S. Cl.
CPC ........ *G11C 11/2259* (2013.01); *G06F 3/0604* (2013.01); *G06F 3/0659* (2013.01); *G06F 3/0673* (2013.01); *G11C 11/221* (2013.01); *G11C 11/2255* (2013.01); *G11C 11/2257* (2013.01); *G11C 11/2273* (2013.01); *G11C 11/2275* (2013.01)

(58) Field of Classification Search
CPC ............ G11C 11/2275; G11C 11/2273; G11C 11/2257; G11C 11/2259
USPC ........................................................ 365/145
See application file for complete search history.

(56) References Cited

U.S. PATENT DOCUMENTS

| | | | |
|---|---|---|---|
| 5,940,316 A * | 8/1999 | Koike | G11C 11/22 365/210.12 |
| 5,959,929 A | 9/1999 | Cowles et al. | |
| 6,088,257 A | 7/2000 | Jeon et al. | |
| 6,356,475 B1 | 3/2002 | Tamura et al. | |

(Continued)

FOREIGN PATENT DOCUMENTS

| CN | 102187397 A | 9/2011 |
|---|---|---|
| CN | 109390007 A | 2/2019 |

(Continued)

OTHER PUBLICATIONS

Chinese Patent Office, "Notification to Grant Patent Right for Invention", issued in connection with Chinese Patent Application No. 202080042453.4 dated Jun. 20, 2022 (7 pages).

(Continued)

*Primary Examiner* — Sung Il Cho
(74) *Attorney, Agent, or Firm* — Holland & Hart LLP

(57) ABSTRACT

Methods, systems, and devices for memory cell biasing techniques are described. A memory cell may be accessed during an access phase of an access operation. A pre-charge phase of the access phase may be initiated. The memory cell may be biased to a voltage (e.g., a non-zero voltage) after the pre-charge phase. In some examples, the memory cell may be biased to the voltage when a word line is unbiased and the memory cell is isolated from the digit line.

18 Claims, 8 Drawing Sheets

(56) References Cited

U.S. PATENT DOCUMENTS

| | | | |
|---|---|---|---|
| 9,640,273 B1* | 5/2017 | Chen | G11C 16/24 |
| 10,074,422 B1* | 9/2018 | Tandingan | G11C 11/2259 |
| 10,153,020 B1 | 12/2018 | Vimercati | |
| 2002/0015323 A1 | 2/2002 | Maruyama | |
| 2002/0036915 A1 | 3/2002 | Ashikaga | |
| 2002/0083495 A1 | 6/2002 | Connett-Porceddu et al. | |
| 2003/0053327 A1* | 3/2003 | Kang | G11C 11/22 365/145 |
| 2003/0076704 A1 | 4/2003 | Ashikaga | |
| 2006/0028890 A1* | 2/2006 | Lee | G11C 11/22 365/189.11 |
| 2006/0215438 A1* | 9/2006 | Suzuki | G11C 11/22 365/145 |
| 2006/0279977 A1 | 12/2006 | Shiga et al. | |
| 2006/0291309 A1 | 12/2006 | Maki | |
| 2009/0103348 A1* | 4/2009 | Du | G11C 11/22 365/145 |
| 2010/0074026 A1* | 3/2010 | Kang | G11C 11/5642 365/185.25 |
| 2010/0103755 A1* | 4/2010 | Chen | G11C 11/417 365/226 |
| 2010/0128513 A1* | 5/2010 | Nishimura | G11C 11/22 365/208 |
| 2012/0008389 A1 | 1/2012 | Kim | |
| 2012/0140545 A1* | 6/2012 | Kim | G11C 13/0002 365/207 |
| 2012/0170349 A1* | 7/2012 | Clinton | G11C 11/2253 365/145 |
| 2013/0058179 A1 | 3/2013 | Petersen et al. | |
| 2015/0187402 A1 | 7/2015 | Chun et al. | |
| 2016/0225415 A1 | 8/2016 | Lee | |
| 2017/0263303 A1* | 9/2017 | Fackenthal | G11C 11/2273 |
| 2017/0309330 A1 | 10/2017 | Pyo | |
| 2017/0372765 A1* | 12/2017 | Kawamura | G11C 11/2273 |
| 2018/0331114 A1 | 11/2018 | Vimercati | |
| 2018/0358076 A1 | 12/2018 | Calderoni et al. | |
| 2019/0043595 A1 | 2/2019 | Vimercati et al. | |
| 2020/0168273 A1* | 5/2020 | Kim | G11C 13/0004 |
| 2020/0202947 A1 | 6/2020 | Kim et al. | |

FOREIGN PATENT DOCUMENTS

| | | |
|---|---|---|
| JP | 09-180467 A | 7/1997 |
| JP | 10-255484 A | 9/1998 |
| JP | 2002-083495 A | 3/2002 |
| JP | 2005-251278 A | 9/2005 |
| JP | 2006-344289 A | 12/2006 |
| WO | 2013/015893 A1 | 1/2013 |

OTHER PUBLICATIONS

ISA/KR, International Search Report and Written Opinion of the international Searching Authority, Int'l Appl. No. PCT/US2020/034657, dated Sep. 9, 2020, Korean Intellectual Property Office, Seo-gu, Daejeon, Republic of Korea, 13 pgs.

Taiwan Intellectual Property Office, "Office Action," issued in connection with ROC (Taiwan) Patent Application No. 109114439, dated Feb. 26, 2021 (8 pages).

Japan Patent Office, "Office Action," issued in connection with Japan Patent Application No. 2021-573145 dated Jan. 10, 2023 (18 pages) (10 pages of English Translation and 8 pages of Original Document).

European Patent Office, "European search report," issued in connection with European Patent Application No. 20823006.0 dated May 2, 2023 (8 pages).

* cited by examiner

MEMORY CELL BIASING TECHNIQUES

CROSS REFERENCE

The present Application for Patent is a continuation of U.S. patent application Ser. No. 16/441,763 by Visconti et al., entitled "MEMORY CELL BIASING TECHNIQUES," filed Jun. 14, 2019, assigned to the assignee hereof, and is expressly incorporated by reference in its entirety herein.

BACKGROUND

The following relates generally to operating a memory array and more specifically to memory cell biasing techniques.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, or increasing data retention, among other metrics. In some cases, there may be a delay between access operations of a memory cell. Each access operation may be an example of a memory cell cycle. Delays between each memory cell cycle may degrade the reliability of the memory cell cycling by inducing cell voltage drops and increasing memory cell fatigue. Such situations may degrade the performance of the memory cell, thereby decreasing the storage capability of the memory cell.

DETAILED DESCRIPTION

In some access operations of a memory device, a delay may be present between pulses of the access operation where access lines are biased (e.g., to a zero value). Over time, returning the memory cell to state, such as a zero state, repeatedly may degrade the performance of the memory cell by increasing memory cell fatigue. In some cases, the memory cell material may breakdown which may decrease the ability for the memory cell to store data and decrease operations during memory cell cycles.

Techniques are described herein for improving a performance of a memory cell by biasing the memory cell to voltage, such as a non-zero voltage, during some periods of an access operation. For example, a memory cell may be accessed during an access phase of an access operation. After the pre-charge phase of the access operation is initiated, the memory cell may be biased to a first voltage. The memory cell may be biased to the first voltage by applying a voltage to the digit line and the plate line of the memory cell. The memory cell may then be biased to a second voltage less than the first voltage after the pre-charge pulse is applied. For example, a second voltage may be applied to the digit line and the plate line of the memory cell. The memory cell may be isolated from the digit line while the memory cell is biased at the second voltage, thereby allowing the memory cell to remain under a low bias during the delay. After a period of time, the memory cell may discharge to a zero voltage due to memory cell or selector device leakage (e.g., discharge of the cell capacitance).

In some cases, the value of the second voltage applied to the memory cell during the pre-charge phase may be based on the state of the memory cell. For example, the value of the second voltage applied to the digit line may be less than the value of the second voltage applied to the plate line when the state is a first state (e.g., logic 0). In other examples, the value of the second voltage applied to the digit line may be greater than the value of the second voltage applied to plate line when the state is a second state (e.g., logic 1). In such cases, second voltage (e.g., low bias) applied to the memory cell may prevent a breakdown of the memory cell material, thereby increasing the ability for the memory cell to store data and increase operations during memory cell cycles.

Features of the disclosure are initially described in the context of a memory system and memory die as described with reference to FIG. 1 Features of the disclosure are described in the context of memory cell biasing techniques as described with reference to FIGS. 2-4. These and other features of the disclosure are further illustrated by and described with reference to an apparatus diagram and flowcharts that relate to memory cell biasing techniques as described with references to FIGS. 5-9.

Figure 1:
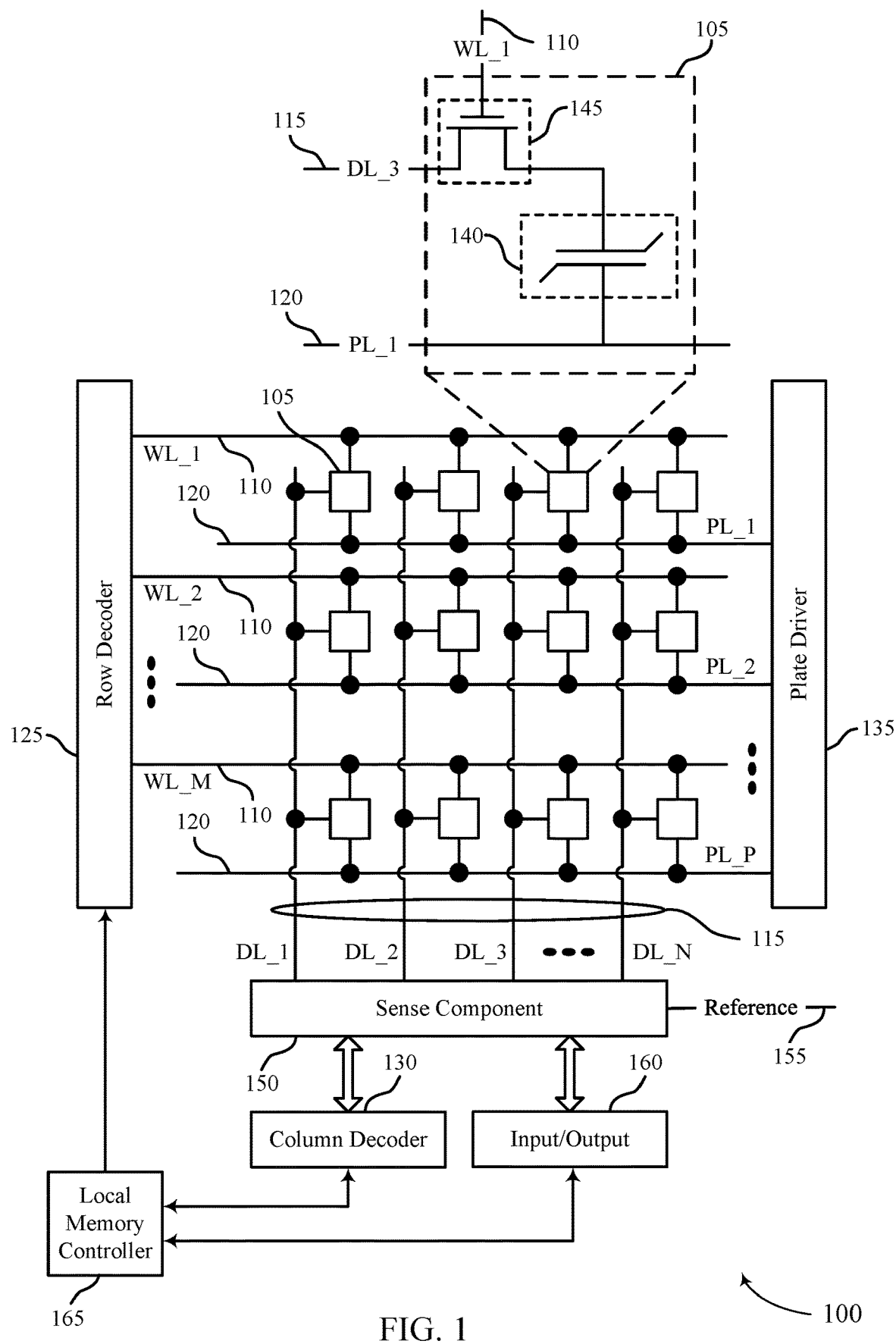
FIG. 1 illustrates an example of a memory die that supports memory cell biasing techniques in accordance with examples as disclosed herein.

FIG. 1 illustrates an example of a memory die 100 in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

A memory cell 105 may store a state (e.g., polarization state or dielectric charge) that represents digital data. In FeRAM architectures, the memory cell 105 may include a capacitor that includes a ferroelectric material to store a charge and/or a polarization representative of the programmable state. In DRAM architectures, the memory cell 105 may include a capacitor that includes a dielectric material to store a charge representative of the programmable state.

Operations such as reading and writing may be performed on memory cells 105 by activating or selecting access lines such as a word line 110, a digit line 115, and/or a plate line 120. In some cases, digit lines 115 may also be referred to as bit lines. References to access lines, word lines, digit lines, plate lines or their analogues, are interchangeable without loss of understanding or operation. Activating or selecting a word line 110, a digit line 115, or a plate line 120 may include applying a voltage to the respective line.

The memory die 100 may include the access lines (e.g., the word lines 110, the digit lines 115, and the plate lines 120) arranged in a grid-like pattern. Memory cells 105 may be positioned at intersections of the word lines 110, the digit lines 115, and/or the plate lines 120. By biasing a word line 110, a digit line 115, and a plate line 120 (e.g., applying a voltage to the word line 110, digit line 115, or plate line 120), a single memory cell 105 may be accessed at their intersection.

Accessing the memory cells 105 may be controlled through a row decoder 125, a column decoder 130, and a plate driver 135. For example, a row decoder 125 may receive a row address from the local memory controller 165 and activate a word line 110 based on the received row address. A column decoder 130 receives a column address from the local memory controller 165 and activates a digit line 115 based on the received column address. A plate driver 135 may receive a plate address from the local memory controller 165 and activates a plate line 120 based on the received plate address. For example, the memory die 100 may include multiple word lines 110, labeled WL_1 through WL_M, multiple digit lines 115, labeled DL_1 through DL N, and multiple plate lines, labeled PL_1 through PL_P, where M, N, and P depend on the size of the memory array. Thus, by activating a word line 110, a digit line 115, and a plate line 120, e.g., WL_1, DL_3, and PL_1, the memory cell 105 at their intersection may be accessed. The intersection of a word line 110 and a digit line 115, in either a two-dimensional or three-dimensional configuration, may be referred to as an address of a memory cell 105. In some cases, the intersection of a word line 110, a digit line 115, and a plate line 120 may be referred to as an address of the memory cell 105.

In some cases, when memory cells 105 are under a low bias during the pre-charge phase, the access operation may be an open-page access operation or a close-page access operation. For example, the local memory controller 165 may activate a row of memory cells comprising the memory cell 105 based on an open-page access operation. In other examples, the local memory controller 165 may deactivate a row of memory cells comprising the memory cell 105 based on a close-page access operation. In some cases, the memory cell 105 may receive, from a host device, an access command to perform the access operation on the memory cell 105. In such cases, the memory cell 105 may be accessed based on receiving the command.

The memory cell 105 may include a logic storage component, such as capacitor 140, and a switching component 145. The capacitor 140 may be an example of a ferroelectric capacitor. A first node of the capacitor 140 may be coupled with the switching component 145 and a second node of the capacitor 140 may be coupled with a plate line 120. The switching component 145 may be an example of a transistor or any other type of switch device that selectively establishes or de-establishes electronic communication between two components. The memory cell 105 may be a ferroelectric memory cell.

Selecting or deselecting the memory cell 105 may be accomplished by activating or deactivating the switching component 145. The capacitor 140 may be in electronic communication with the digit line 115 using the switching component 145. For example, the capacitor 140 may be isolated from digit line 115 when the switching component 145 is deactivated, and the capacitor 140 may be coupled with digit line 115 when the switching component 145 is activated. In some cases, the switching component 145 is a transistor and its operation is controlled by applying a voltage to a transistor gate, where the voltage differential between the transistor gate and transistor source is greater or less than a threshold voltage of the transistor. In some cases, the switching component 145 may be a p-type transistor or an n-type transistor. The word line 110 may be in electronic communication with the gate of the switching component 145 and may activate/deactivate the switching component 145 based on a voltage being applied to word line 110.

A word line 110 may be a conductive line in electronic communication with a memory cell 105 that is used to perform access operations on the memory cell 105. In some architectures, the word line 110 may be in electronic communication with a gate of a switching component 145 of a memory cell 105 and may be configured to control the switching component 145 of the memory cell. In some architectures, the word line 110 may be in electronic communication with a node of the capacitor of the memory cell 105 and the memory cell 105 may not include a switching component.

A digit line 115 may be a conductive line that connects the memory cell 105 with a sense component 150. In some architectures, the memory cell 105 may be selectively coupled with the digit line 115 during portions of an access operation. For example, the word line 110 and the switching component 145 of the memory cell 105 may be configured to selected couple and/or isolate the capacitor 140 of the memory cell 105 and the digit line 115. In some architectures, the memory cell 105 may be in electronic communication (e.g., constant) with the digit line 115. In some examples, a voltage applied to the digit line 115 may be based on the state of the memory cell 105. For example, the voltage applied to the digit line 115 in a first state may be lower than a voltage applied to the digit line 115 in a second state.

A plate line 120 may be a conductive line in electronic communication with a memory cell 105 that is used to perform access operations on the memory cell 105. The plate line 120 may be in electronic communication with a node (e.g., the cell bottom) of the capacitor 140. The plate line 120 may be configured to cooperate with the digit line 115 to bias the capacitor 140 during access operation of the memory cell 105. In some examples, a voltage may be applied to the plate line 120. In such cases, the plate line 120 may be a decoded plate or a fixed plate.

The sense component 150 may be configured to determine a state (e.g., a polarization state or a charge) stored on the capacitor 140 of the memory cell 105 and determine a logic state of the memory cell 105 based on the detected state. The charge stored by a memory cell 105 may be extremely small, in some cases. As such, the sense component 150 may include one or more sense amplifiers to amplify the signal output of the memory cell 105. The sense amplifiers may detect minute changes in the charge of a digit line 115 during a read operation and may produce signals corresponding to either a logic 0 or a logic 1 based on the detected charge. During a read operation, the capacitor 140 of memory cell 105 may output a signal (e.g., discharge a charge) to its corresponding digit line 115. The signal may cause a voltage of the digit line 115 to change. The sense component 150 may be configured to compare the signal received from the memory cell 105 across the digit line 115 to a reference signal 155 (e.g., a reference voltage). The sense component 150 may determine the stored state of the memory cell 105 based on the comparison. For example, in binary-signaling, if digit line 115 has a higher voltage than the reference signal 155, the sense component 150 may determine that the stored state of memory cell 105 is a logic 1, and, if the digit line 115 has a lower voltage than the reference signal 155, the sense component 150 may determine that the stored state of the memory cell 105 is a logic 0. The sense component 150 may include various transistors or amplifiers to detect and amplify a difference in the signals. The detected logic state of the memory cell 105 may be provided as an output of the sense component 150 (e.g., to an input/output 160), and may indicate the detected logic state to another component of a memory device that includes the memory die 100, such as a device memory controller (e.g., directly or using the local memory controller 165). In some cases, the sense component 150 may be in electronic communication with the row decoder 125, the column decoder 130, and/or the plate driver 135.

In some cases, the sense component 150 may include a sense amplifier. The complexity of the sense amplifier may increase when a low bias is applied to the memory cell 105 during the pre-charge phase. Due to the presence of a low bias at the end of the pre-charge phase, the voltage of the digit line 115 and the plate line 120 may not be a zero voltage, thereby increasing the complexity of the sense amplifier. The bias may be applied to the sense amplifier from outside the memory array. In such cases, the sense amplifier may include a timing component to apply the voltage to the digit line 115 and the plate line 120 after the pre-charge phase is initiated.

The local memory controller 165 may control the operation of memory cells 105 through the various components (e.g., row decoder 125, column decoder 130, plate driver 135, and sense component 150). In some cases, one or more of the row decoder 125, column decoder 130, and plate driver 135, and sense component 150 may be co-located with the local memory controller 165. The local memory controller 165 may be configured to receive one or more commands and/or data from an external memory controller, translate the commands and/or data into information that can be used by the memory die 100, perform one or more operations on the memory die 100, and communicate data from the memory die 100 to the external memory controller (or the device memory controller) in response to performing the one or more operations. The local memory controller 165 may generate row, column, and/or plate line address signals to activate the target word line 110, the target digit line 115, and the target plate line 120. The local memory controller 165 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 165 may be configured to perform a pre-charge operation on the memory die 100. A pre-charge operation may comprise pre-charging one or more components and/or access lines of the memory die 100 to one or more predetermined voltage levels. In some instances, the memory cell 105 and/or portions of the memory die 100 may be pre-charged between different access operations. In some instances, the digit line 115 and/or other components may be pre-charged before a read operation. In some cases, memory cell 105 may be biased to a low voltage during the pre-charge operation. In such cases, the memory cell 105 may remain under the low bias between different access operations. Maintaining a low bias on the memory cell 105 between different access operations may inhibit voltage drops on the memory cell 105 and increase the read window of the memory cell 105.

In some cases, the local memory controller 165 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 165 may identify a target memory cell 105 on which to perform the write operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or the target plate line 120 (e.g., applying a voltage to the word line 110, digit line 115, or the plate line 120), to access the target memory cell 105. The local memory controller 165 may apply a specific signal (e.g., voltage) to the digit line 115 and a specific signal (e.g., voltage) to the plate line 120 during the write operation to store a specific state in the capacitor 140 of the memory cell 105, the specific state being indicative of a desired logic state.

In some cases, the local memory controller 165 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 165 may identify a target memory cell 105 on which to perform the read operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or a target plate line 120 (e.g., applying a voltage to the word line 110, the digit line 115, or the plate line 120), to access the target memory cell 105. The target memory cell 105 may transfer a signal to the sense component 150 in response to biasing the access lines.

The sense component 150 may amplify the signal. The local memory controller 165 may fire the sense component 150 (e.g., latch the sense component) and thereby compare the signal received from the memory cell 105 to the reference signal 155. Based on that comparison, the sense component 150 may determine a logic state that is stored on the memory cell 105. The local memory controller 165 may communicate the logic state stored on the memory cell 105 to the external memory controller (or the device memory controller) as part of the read operation. In some cases, a state stored on the memory cell may be identified as part of the read operation. In such cases, a value of a voltage applied to the memory cell 105 during the pre-charge phase may be based on the state stored on the memory cell 105.

In some memory architectures, accessing the memory cell 105 may degrade or destroy the logic state stored in a memory cell 105. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 165 may perform a re-write operation or a refresh operation to return the memory cell to its original logic state. The local memory controller 165 may re-write the logic state to the target memory cell after a read operation. In some cases, the re-write operation may be considered part of the read operation. Additionally, activating a single access line, such as a word line 110, may disturb the state stored in some memory cells in electronic communication with that access line. Thus, a re-write operation or refresh operation may be performed on one or more memory cells that may not have been accessed.

Figure 2A:
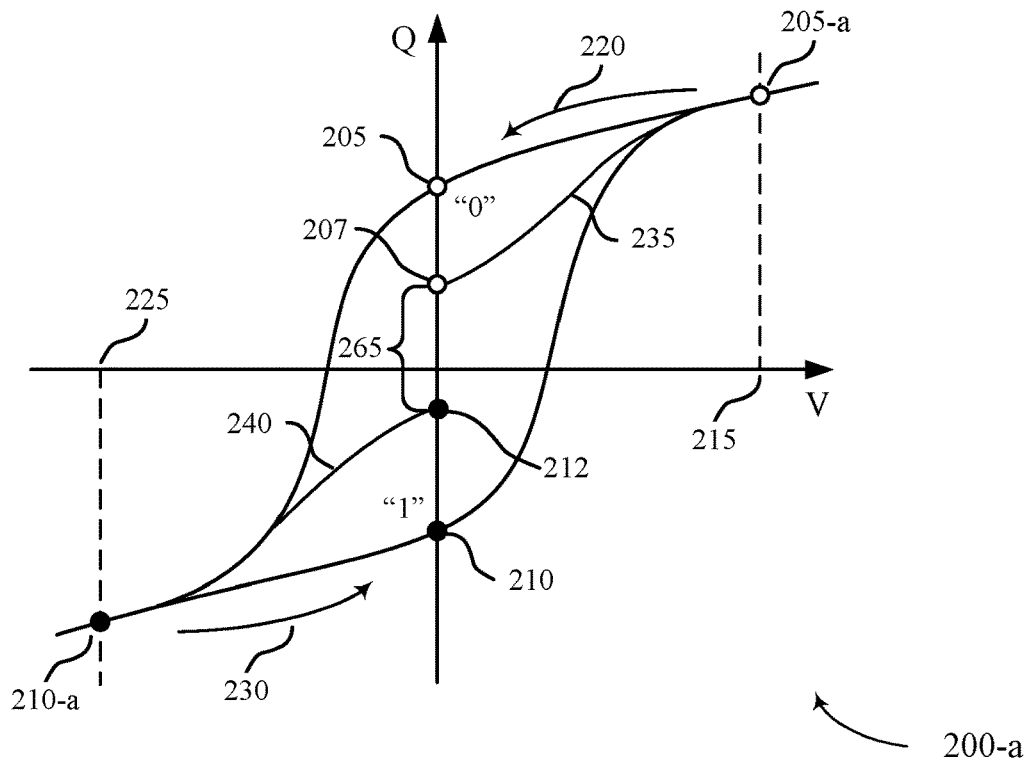
FIGS. 2A and 2B illustrate example hysteresis plots for a memory cell that supports memory cell biasing techniques in accordance with examples as disclosed herein.
Figure 2B:
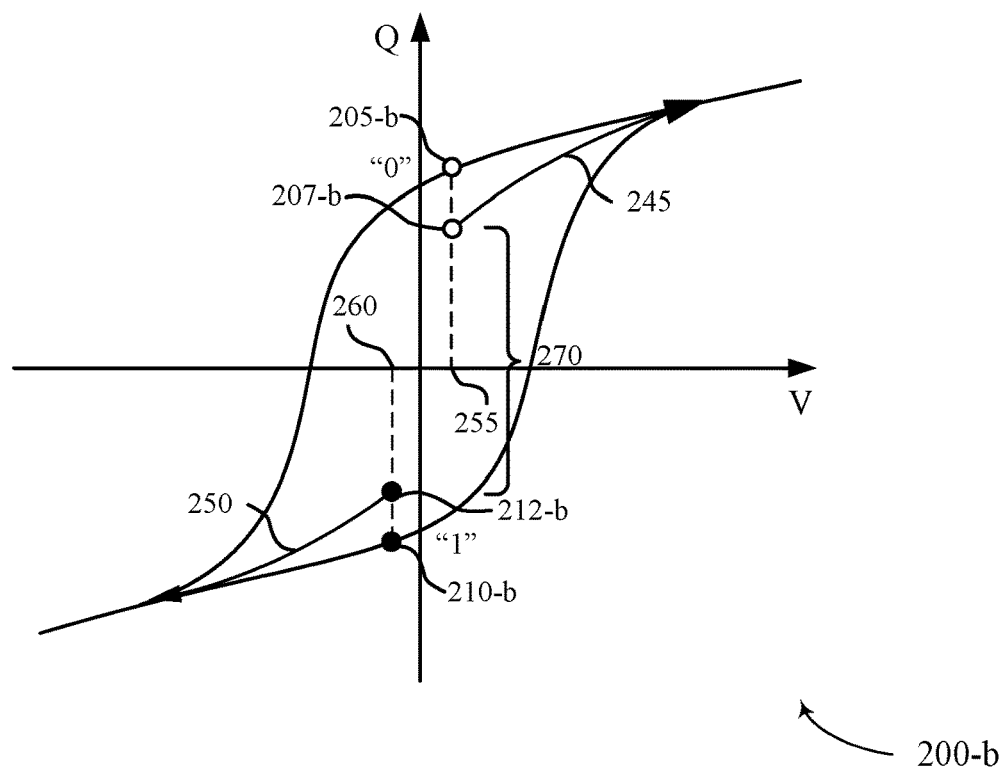

FIGS. 2A and 2B illustrate examples of non-linear electrical properties with hysteresis plots 200-*a* and 200-*b* for a memory cell that supports memory cell biasing technique in accordance with examples of the present disclosure. Hysteresis plot 200-*a* illustrates an example ferroelectric memory cell writing. Hysteresis plot 200-*b* illustrates an example ferroelectric memory cell under a low bias during the pre-charge phase. Hysteresis plots 200-*a* and 200-*b* depict the charge, Q, stored on a ferroelectric capacitor (e.g., capacitor 140 of FIG. 1) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis plots 200-*a* and 200-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis plots 200-*a* and 200-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis plots 200-*a* and 200-*b*.

As depicted in hysteresis plot 200-*a*, the ferroelectric material may maintain a positive or negative polarization with a zero voltage difference, resulting in two possible charged states: charge state 205 and charge state 210. According to the example of FIG. 2, charge state 205 represents a logic 0 and charge state 210 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 215 across the capacitor results in charge accumulation until charge state 205-*a* is reached. As illustrated in hysteresis plot 200-*a*, when voltage 215 is reduced, charge state 205-*a* may follow path 220 until it reaches charge state 205 at zero voltage. As an effect of the zero voltage bias applied during the delay between pulses, charge may further decrease from charge state 205 to charge state 207. In such cases, the decrease from charge state 205 to charge state 207 may be an example of the backswitching effect on logic 0. Curve 235 may show the charge loaded on the capacitor terminal to bring the charge back to the charge state 205-*a* after backswitching. Similarly, charge state 210 is written by applying a net negative voltage 225, which results in charge state 210-*a*. When voltage 225 is increased, charge state 210-*a* follows path 230 until it reaches charge state 210 at zero voltage. As an effect of the zero voltage bias applied during the delay between pulses, charge may further increase from charge state 210 to charge state 212. In such cases, the increase from charge state 210 to charge state 212 may be an example of the backswitching effect on logic 1. Curve 240 may show the charge loaded on the capacitor terminal to bring the charge back to the charge state 210-*a* after backswitching. The difference between charge state 207 and charge state 212 may also be referred to as the remnant polarization (Pr) values 265, i.e., the polarization (or charge) that remains upon removing the external bias (e.g., voltage).

In memory cells where a zero voltage is consistently applied between pulses, causing repeated backswitching from charge state 205 to charge state 207 or from charge state 210 to charge state 212, the memory cell may fatigue and performance may degrade. For example, the charge (e.g., charge state 205-*a*) accumulated on a fatigued cell by applying a voltage 215 may be lower compared to the charge on an unfatigued cell. Similarly, the charge (e.g., charge state 210-*a*) accumulated on a fatigued cell by applying a voltage 225 may be lower compared to the charge on an unfatigued cell. This may be an effect of the backswitching that occurs at zero voltage.

Hysteresis plot 200-*b* in FIG. 2B illustrates what happens when the memory cell is biased to a non-zero voltage between pulses of access operations. After a positive programming pulse, the voltage on the cell may be reduced to a non-zero positive voltage 255, and the charge may reach charge state 205-*b*. As an effect of the non-zero positive voltage 255 applied during the delay between pulses, the charge may decrease from charge state 205-*b* to charge state value 207-*b* (e.g., backswitching effect on logic 0 with positive bias applied). Curve 245 may show the charge loaded on the capacitor terminal to bring the charge back to the maximum value after the backswitching. Charge state 207-*b* may be lower than the charge state 207 on curve 235.

Similarly, after a negative programming pulse, the voltage on the cell may be increased to a non-zero negative voltage 260, and the charge may reach charge state 210-*b*. As an effect of the non-zero negative voltage 260 applied during the delay between pulses, the charge may decrease from charge state 210-*b* to charge state 212-*b* (e.g., backswitching effect on logic 1 with negative bias applied). Curve 250 may show the charge loaded on the capacitor terminal to bring the charge back to the maximum value after the backswitching. Charge state 212-*b* may be lower than the charge state 212 on curve 240. The difference between charge state 207-*b* and charge state 212-*b* may also be referred to as the remnant polarization values 270, i.e., the polarization (or charge) that remains upon removing the external bias (e.g., voltage). The non-zero voltage may be less than the magnitude of the voltages of the pulses of the access operations.

The reduction of charges (e.g., backswitching effect) repeated over time when a non-zero voltage is applied between pulses, as illustrated in hysteresis plot 200-*b*, may cause a reduction of the fatigue on the memory cell. In such cases, the signal may increase as compared to the signal when a zero voltage is applied between pulses (e.g., as illustrated in hysteresis plot 200-*b*). For example, the remnant polarization values 265 are lower than remnant polarization values 270.

Figure 3:
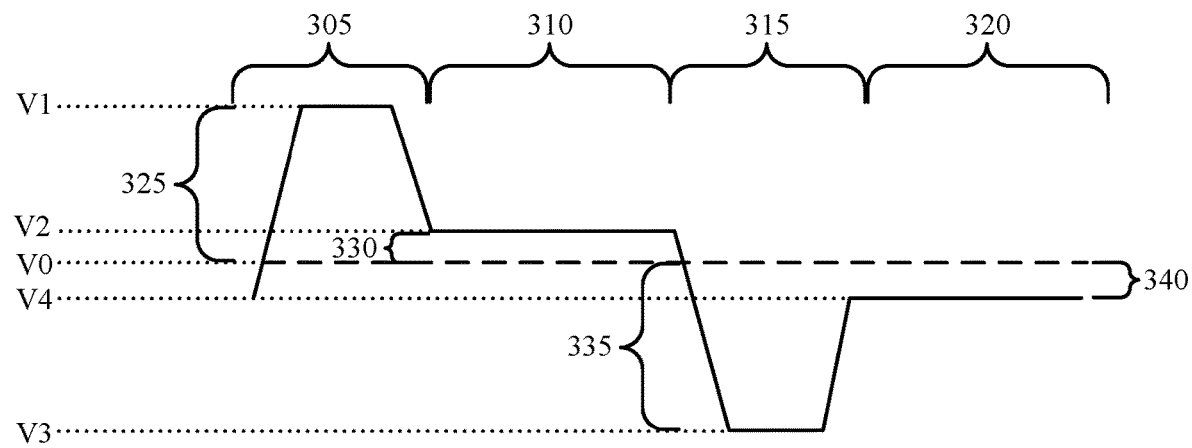
FIG. 3 illustrates a timing diagram that supports memory cell biasing techniques in accordance with examples as disclosed herein.

FIG. 3 illustrates a timing diagram 300 that supports memory cell biasing technique in accordance with examples of the present disclosure. Timing diagram 300 may include activate pulse 305, first delay portion 310, pre-charge pulse 315, and second delay portion 320. Timing diagram 300 depicts the voltage, V, as a function of time, t.

The memory cell may be accessed during an access phase of an access operation by applying activate pulse 305. The magnitude 325 of activate pulse 305 may be a non-zero voltage (e.g., voltage V1). In some cases, the polarity of the voltage of the activate pulse 305 may be a positive polarity or a negative polarity. The first delay portion 310 may occur after the activate pulse 305 and before the pre-charge pulse 315. The presence of first delay portion 310 between the activate pulse 305 and the pre-charge pulse 315 may be representative of an open-page access operation. In some cases, the duration of first delay portion 310 may be based on the memory device.

Some memory devices may bias a memory cell to a zero voltage during the first delay portion 310. Biasing such memory cell to a zero voltage may strain the memory cell over time and may reduce the usable life-span of the memory cell. In some cases, to address at least some of these issues, the memory device may bias the memory cell to a non-zero voltage (e.g., the magnitude 330 may be voltage V2) during the first delay portion 310. In other examples, the magnitude 330 of first delay portion 310 may a zero voltage (e.g., voltage V0). The polarity of the voltage on the memory cell during the first delay portion 310 may be a positive polarity or a negative polarity. In some examples, the polarity of the voltage on the memory cell during the first delay portion 310 may be the same as the polarity of the voltage applied during the activate pulse 305. For example, if the activate pulse 305 has the magnitude 325 that is a negative voltage (e.g., voltage V3), the magnitude 330 of the biasing during the first delay portion 310 may also be a negative voltage (e.g., voltage V4).

The pre-charge phase of the access operation may be initiated by applying the pre-charge pulse 315. During the pre-charge phase, the memory cell may be biased to a voltage by applying the pre-charge pulse 315. The pre-charge pulse 315 may have a magnitude 335 which may be a non-zero voltage (e.g., voltage V3). The polarity of the voltage of the pre-charge pulse 315 may be a positive polarity or a negative polarity. In some cases, the voltage of the pre-charge pulse 315 may include a polarity different than the polarity of the voltage of the activate pulse 305.

After the memory cell is based to the voltage of the pre-charge pulse 315, the memory cell may be biased to a voltage that is different from the voltage of the pre-charge pulse 315 during the second delay portion 320. The second delay portion 320 may occur after the pre-charge pulse 315. In such cases, the second delay portion 320 may be representative of a close-page access operation.

The magnitude 340 of a voltage during a delay portion may be different than the magnitude 335 of the pre-charge pulse 315. In some examples, the magnitude 340 of the voltage (e.g., voltage V4) during the second delay portion 320 may be less than the magnitude 335 (e.g., voltage V3) of the pre-charge pulse 315. In some examples, the magnitude 340 of the voltage during the second delay portion 320 may be greater than the magnitude 335 of the pre-charge pulse 315. The voltage applied during the second delay portion 320 may be a non-zero voltage. In some examples, a negative voltage (e.g., voltage V4) applied during a delay portion (e.g., portions 310 or 320) may have an absolute value of a magnitude that is less than an absolute value of a magnitude of the negative voltage (e.g., voltage V3) of the pre-charge pulse 315. In other examples, a positive voltage (e.g., voltage V2) applied during a delay portion may have an absolute value of a magnitude that is less than an absolute value of a magnitude of the negative voltage (e.g., voltage V3) of the pre-charge pulse 315. The absolute value of magnitude of the voltage (whether positive or negative) applied during a delay portion may be different than an absolute value of a magnitude of a voltage (whether positive or negative) of a pulse (e.g., pulses 305 and 315). For example, in some cases, the absolute value of magnitude of the positive voltage (e.g., voltage V2) applied during a delay portion may be different than an absolute value of a magnitude of a negative voltage (e.g., voltage V3) of a pulse (e.g., pulse 305 or 315).

The polarity of the voltage applied during the second delay portion 320 may be the same polarity as the voltage applied during the pre-charge pulse 315. For example, if the pre-charge pulse 315 has the magnitude 335 that is a positive voltage (e.g., voltage V1), the magnitude 340 of the biasing during the second delay portion 320 may also be a positive voltage (e.g., voltage V2).

In some examples, the access operation may be a write operation. In such cases, the value of the voltage biased to the memory cell during the second delay portion 320 may be based on the state of the memory cell. For example, when a first state (e.g., logic 0) is written to the memory cell, the value of the voltage of the pre-charge pulse 315 may be a positive value (e.g., voltage V1). That is, the value of the voltage biased to the memory cell during the second delay portion 320 may be a positive value (e.g., voltage V2). In such cases, the positive value of the voltage applied during the second delay portion 320 may inhibit P-drops on the memory cell (e.g., parasitic activity associated with a positive bias applied).

When a second state (e.g., logic 1) is written to the memory cell, the value of the voltage of the pre-charge pulse 315 may be a negative value (e.g., voltage V3). That is, the value of the voltage biased to the memory cell during the second delay portion 320 may be a negative value (e.g., voltage V4). In such cases, the negative value of the voltage applied during the second delay portion 320 may inhibit N-drops on the memory cell (e.g., parasitic activity associated with a negative bias applied).

In other examples, the access operation may be a read operation. In such cases, the state stored on the memory cell may be identified based on accessing the memory cell. The value of the voltage applied during the second delay portion 320 may be identified based on the state of the memory cell. For example, biasing the memory cell to the voltage V3 may be based on identifying the value voltage V3.

For example, the memory cell may be accessed after second delay portion 320 during a second access phase of a second access operation (e.g., by applying a subsequent access pulse). In such cases, a second pre-charge phase may be initiated (e.g., by applying a subsequent pre-charge pulse after a first delay portion 310). The memory cell may be biased to a voltage less than the voltage of the first pre-charge phase. The memory cell may then be biased to a voltage during a second delay portion where the voltage is less than the voltage of the first delay portion.

Figure 4:
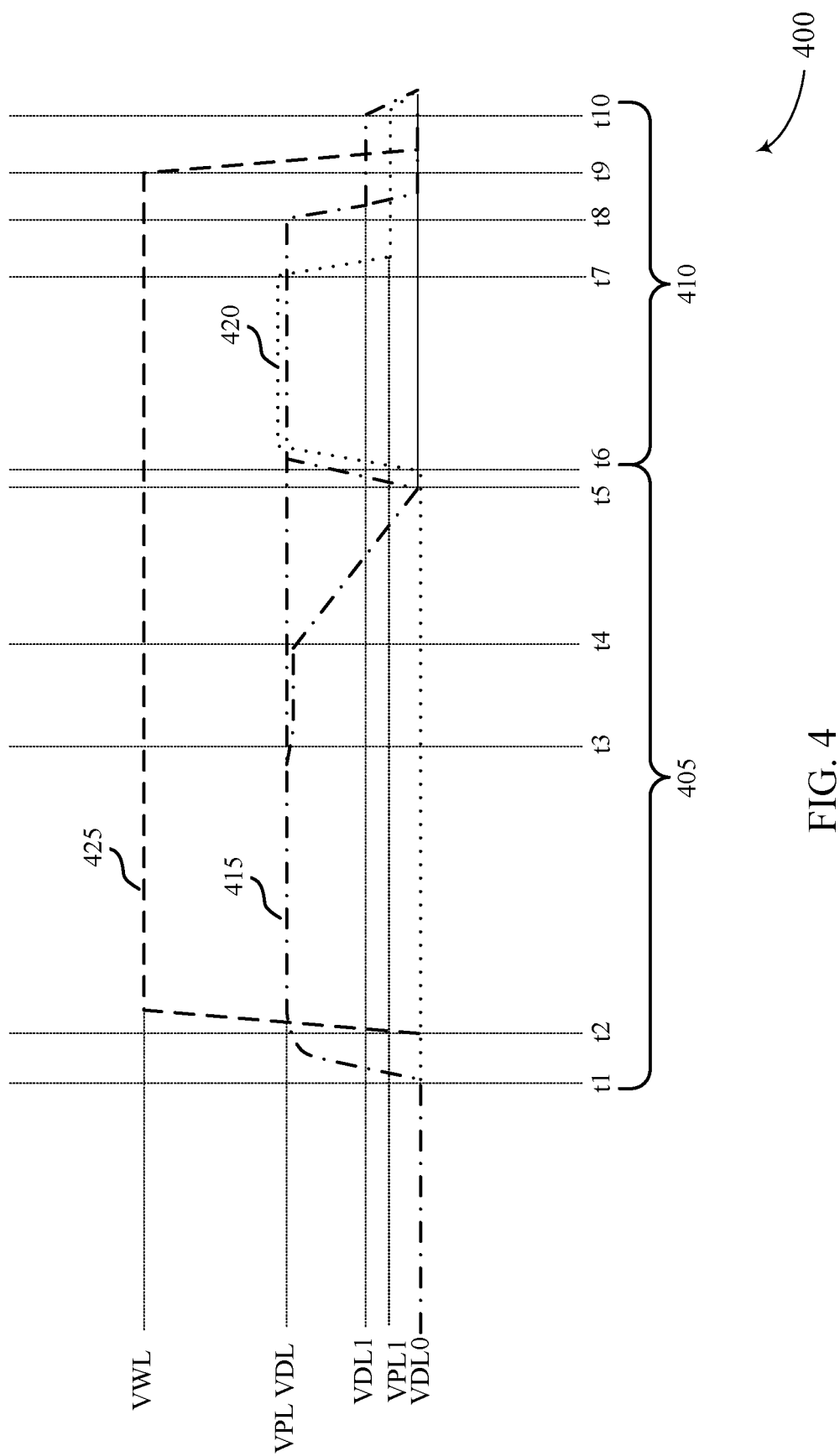
FIG. 4 illustrates an example voltage plot for a memory cell that that memory cell biasing techniques in accordance with examples as disclosed herein.

FIG. 4 illustrates an example voltage plot 400 for memory cell biasing techniques in accordance with examples of the present disclosure. Voltage plot 400 illustrates an example ferroelectric memory cell sensing and pre-charging process. For example, voltage plot 400 may include access phase 405 and pre-charge phase 410. Voltage plot 400 depicts the voltage, V, as a function of time, t. For example, voltage plot 400 may include digit line voltage 415, plate line voltage 420, and word line voltage 425. The voltage plot 400 may represent similar operations as illustrated by the timing diagram 300 described with reference to FIG. 3.

Voltage plot 400 illustrates examples of a read operation. Access phase 405 may represent a period when a memory cell may be accessed during the access phase of the access operation. At time t1, the digit line may be charged to digit line voltage 415. At time t2, the word line may be charge to word line voltage 425. In such cases, a voltage may be applied to the word line coupled with the memory cell during the access phase 405 of the access operation. The memory cell may be accessed based on applying word line voltage 425 to the word line.

During an activation phase of the access phase 405 (e.g., between time t2 and t3), the signal on the memory cell may develop, and the digit line voltage 415, the plate line voltage 420, and the word line voltage 425 may be maintained at the respective voltages. In some examples, the signal is amplified after the activation phase of the access operation. In some cases, the access operation is a read operation or write operation.

At time t3, the memory cell may be programmed to a state. For example, the memory cell may be programmed to a first state or a second state. If the memory cell may be programmed to a first state, the digit line voltage 415 may decrease at time t4 until time t5. If the memory cell may be programmed to a second state, the digit line voltage 415 may be maintained. The access operation may be a write-back operation when the digit line voltage 415 is maintained. (e.g., at VDL).

At time t5, the pre-charge phase 410 of the access operation may be initiated. The digit line voltage 415 may increase as a voltage is applied to the digit line at time t5. In such cases, the memory cell may be programmed to the first state. At time t6, the plate line voltage 420 may increase as a voltage is applied to the plate line during the pre-charge phase 410.

At time t7, the memory device may begin to resolve the pre-charge phase 410 of the access operation and resolve the access operation at large. For example, the plate line voltage 420 may decrease. In some cases, the plate line voltage 420 may be biased to a lower voltage such as a voltage (e.g., VPL1). The voltage VPL1 may be a non-zero voltage configured to extend the usable life of the memory cell. In such cases, the voltage (e.g., VPL) applied after time t7 may be less than the voltage applied at t6 to the plate line. For example, the voltage applied to the plate line at time t7 may be 100 mV.

At time t8, the memory device may continue resolving the pre-charge phase 410 by biasing the digit line voltage 415 to a lower voltage (e.g., VDL1). The voltage applied to the digit line at time t8 may be less than the voltage (e.g., VDL) applied to the digit line between times t6 and t8. The voltage applied to the digit line may be based on the state stored in or sensed in the memory cell during the access operation. In some examples, a first voltage (e.g., VDL0) may be applied to the digit line when a first state is sensed or stored in the memory cell. The first voltage (e.g., VDL0) may be less than the voltage (e.g., VPL1) applied to the plate line when the memory cell is programmed to a first state. For example, the voltage applied to the digit line at time t8 may be a ground voltage (e.g., 0 V).

In other examples, a second voltage (e.g., VDL1) may be applied to the digit line when a second state is sensed or stored in the memory cell. The second voltage (e.g., VDL1) may be greater than the voltage (e.g., VPL1) applied to the plate line at time t7 when the memory cell is programmed to a second state. The voltage applied to the digit line at time t8 may be 200 mV. The value of the voltage applied to the digit line at time t8 may be based on the state of the memory cell (e.g., a first state or a second state). In some cases, the state stored on the memory cell may be identified based on the access operation. Applying the different voltages to the digit line may cause the memory cell to be biased to different polarities. For example, if the digit line is biased to the second voltage (e.g., VDL1), the memory cell may be biased with a first polarity and the memory cell may be biased to a second polarity when the digit line is biased to the first voltage (e.g., VDL0).

At time t9, the memory device may resolve and/or complete the access operation by deactivating the word line voltage. Upon biasing the word line voltage, the memory cell may be isolated from the digit line. In some cases, the memory cell may be biased to a lower voltage at the time that the memory cell is isolated from the digit line. In other systems, the memory cell may be unbiased or biased to a zero-voltage when the word line is deactivated at the end of an access operation. At time t9, the word line voltage 425 may decrease as a ground voltage is applied to the word line.

The ground voltage may be applied to the word line while the voltage is applied to the digit line and the voltage is applied to the plate line.

The digit line voltage 415 and the plate line voltage 420 may be maintained during and/or after the memory cell is isolated from the digit line. In such cases, the memory cell may be maintained at a low bias until the transistor coupled with the word line shuts off. For example, the plate line voltage 420 may be maintained at voltage VPL1 and the digit line voltage 415 may be maintained at voltage VDL1. However, the plate line voltage 420 and the digit line voltage 415 may be maintained at the respective low biases even after the word line is turned off and until the memory cell discharges.

At time t10, the digit line voltage 415 and the plate line voltage 420 may decrease as the digit line and the plate line are biased to a zero voltage. The memory cell may prepare for the next access operation at the end of the pre-charge phase 410. In some cases, the duration of the pre-charge phase 410 may increase when the memory cell is maintained at the low bias after the word line is deactivated as compared to other timings where a memory cell is biased to ground voltage before the word line is turned off.

Figure 5:
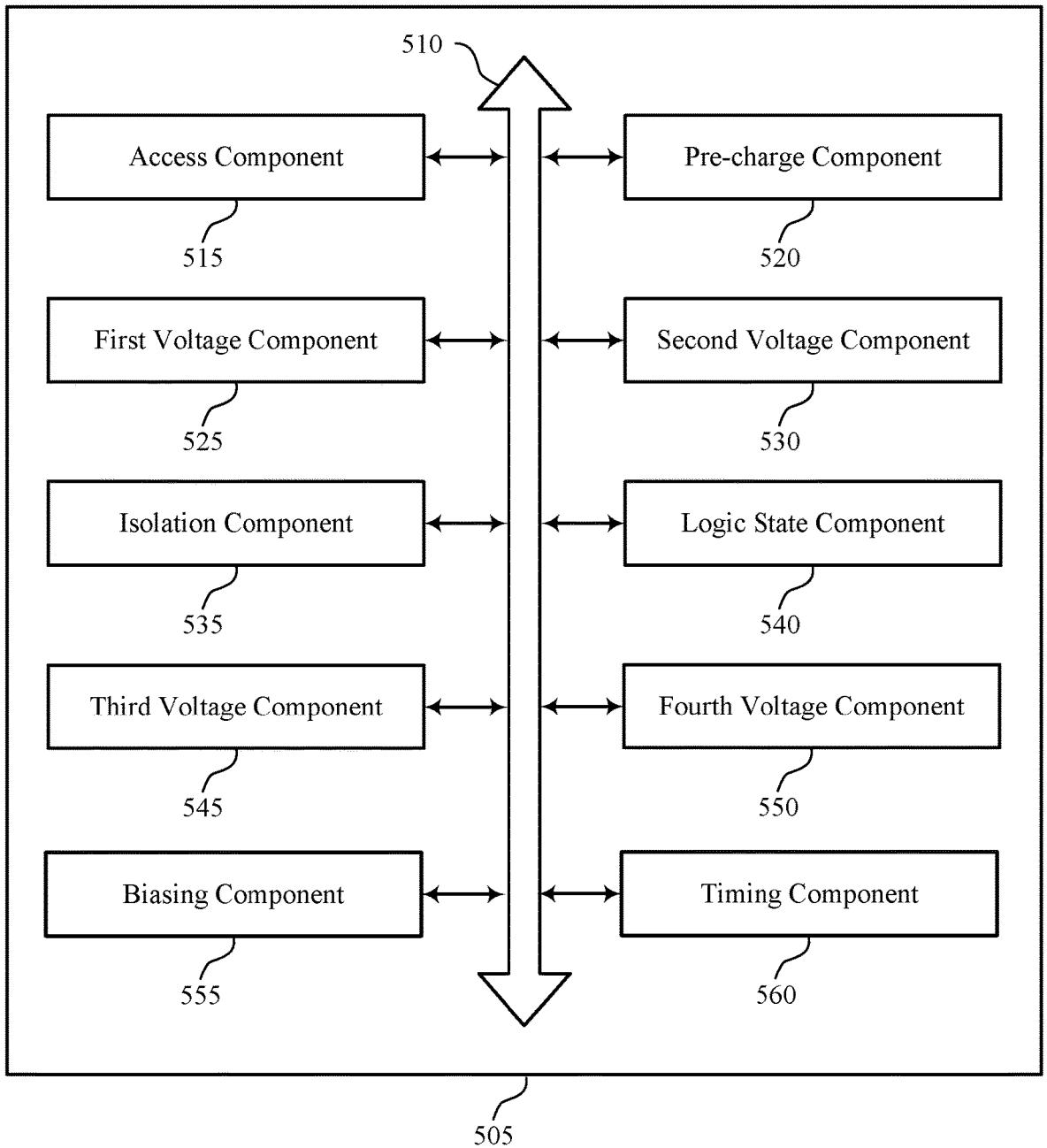
FIG. 5 illustrates a block diagram of a memory controller that supports memory cell biasing techniques in accordance with examples as disclosed herein.

FIG. 5 shows a block diagram 500 of a memory controller 505 that supports memory cell biasing techniques in accordance with examples as disclosed herein. The memory controller 505 may be an example of a memory controller as described with reference to FIG. 1. The memory controller 505 may include access component 515, pre-charge component 520, first voltage component 525, second voltage component 530, isolation component 535, logic state component 540, third voltage component 545, fourth voltage component 550, biasing component 555, and timing component 560. Each of these modules may communicate, directly or indirectly, with one another via one or more buses. (e.g., bus 510).

The access component 515 may access, during an access phase of an access operation, a memory cell. In some cases, the access operation comprises a read operation. In some cases, the access operation comprises a write operation. In some examples, the access component 515 may receive, from a host device, an access command to perform the access operation on the memory cell, wherein accessing the memory cell is based at least in part on receiving the access command. In some examples, the access component 515 may access, after the access operation and during a second access phase of a second access operation, the memory cell. In some examples, the access component 515 may activate a row of memory cells comprising the memory cell based at least in part on an open-page access operation. In some examples, the access component 515 may deactivate a row of memory cells comprising the memory cell based at least in part on a close-page access operation. In some examples, the memory cell comprises a ferroelectric memory cell. In some examples, the access component 515 may access, during an access phase of an access operation, a memory cell.

The pre-charge component 520 may initiate a pre-charge phase of the access operation based at least in part on accessing the memory cell. In some examples, the pre-charge component 520 may initiate a second pre-charge phase of the second access operation based at least in part on accessing the memory cell.

The first voltage component 525 may bias, during the pre-charge phase, the memory cell to a first voltage. In some examples, the first voltage component 525 may bias, during the second pre-charge phase, the memory cell to a third voltage that is less than the first voltage. In some examples, the first voltage component 525 may apply, during the pre-charge phase, a first voltage to a digit line coupled with the memory cell. In some examples, the first voltage component 525 may apply a first voltage to a digit line coupled with a memory cell during a pre-charge phase of an access operation.

In some examples, the first voltage is different than the second voltage. In some examples, the value of the first voltage is less than a value of the second voltage applied to the plate line when the state is a first state. In some examples, the value of the first voltage is greater than the value of the second voltage when the state is a second state.

The second voltage component 530 may bias, during the pre-charge phase, the memory cell to a second voltage that is less than the first voltage after biasing the memory cell to the first voltage. In some examples, the second voltage component 530 may identify a value of the second voltage based at least in part on the state associated with the memory cell during the access operation, wherein biasing the memory cell to the second voltage is based at least in part on identifying the value of the second voltage. In some examples, the second voltage is a non-zero voltage.

In some examples, second voltage component 530 may bias, during the second pre-charge phase, the memory cell to a fourth voltage that is less than the second voltage after biasing the memory cell to the third voltage. Second voltage component 530 may apply, during the pre-charge phase, a second voltage to a plate line coupled with the memory cell. Second voltage component 530 may apply a second voltage to a plate line coupled with the memory cell during the pre-charge phase of the access operation.

The isolation component 535 may isolate the memory cell from a digit line while the memory cell is biased to the second voltage. In some examples, the isolation component 535 may isolate the memory cell from the digit line while the third voltage is applied to the digit line and the fourth voltage is applied to the plate line. In some examples, the isolation component 535 may isolate the memory cell from the digit line while applying the first voltage to the digit line and applying the second voltage to the plate line.

The logic state component 540 may identify a state stored on the memory cell based at least in part on accessing the memory cell, wherein a value of the second voltage is based at least in part on the state of the memory cell. In some examples, the logic state component 540 may identify a state associated with the memory cell during the access operation. In some examples, the logic state component 540 may identify a state stored in the memory cell based at least in part on accessing the memory cell, wherein a value of the third voltage is based at least in part on the state of the memory cell.

In some examples, the logic state component 540 may identify a value of the first voltage applied to the digit line based at least in part on identifying the state. In some examples, the logic state component 540 may identify a state associated with the memory cell during the access operation, wherein a polarity of a voltage applied to the memory cell is based at least in part on identifying the state of the memory cell.

The third voltage component 545 may apply, during the pre-charge phase, a third voltage to the digit line after applying the first voltage to the digit line, wherein the third voltage is less than the first voltage. In some examples, the third voltage applied to the digit line is less than the fourth voltage applied to the plate line. In some cases, the third voltage applied to the digit line is greater than the fourth voltage applied to the plate line.

The fourth voltage component 550 may apply, during the pre-charge phase of the access operation, a fourth voltage to the plate line after applying the second voltage to the plate line, wherein the fourth voltage is less than the second voltage.

The biasing component 555 may bias the plate line and the digit line to a zero voltage after isolating the memory cell from the digit line. In some examples, the biasing component 555 may apply a voltage to a word line coupled with the memory cell during the access phase of the access operation, wherein accessing the memory cell is based at least in part on applying the voltage to the word line. In some examples, the biasing component 555 may apply a ground voltage to the word line while applying the third voltage to the digit line and applying the fourth voltage to the plate line.

The timing component 560 may maintain a voltage of the memory cell at the second voltage after isolating the memory cell from the digit line. In some examples, the timing component 560 may maintain the first voltage on the digit line and the second voltage on the plate line after the memory cell is isolated from the digit line.

Figure 6:
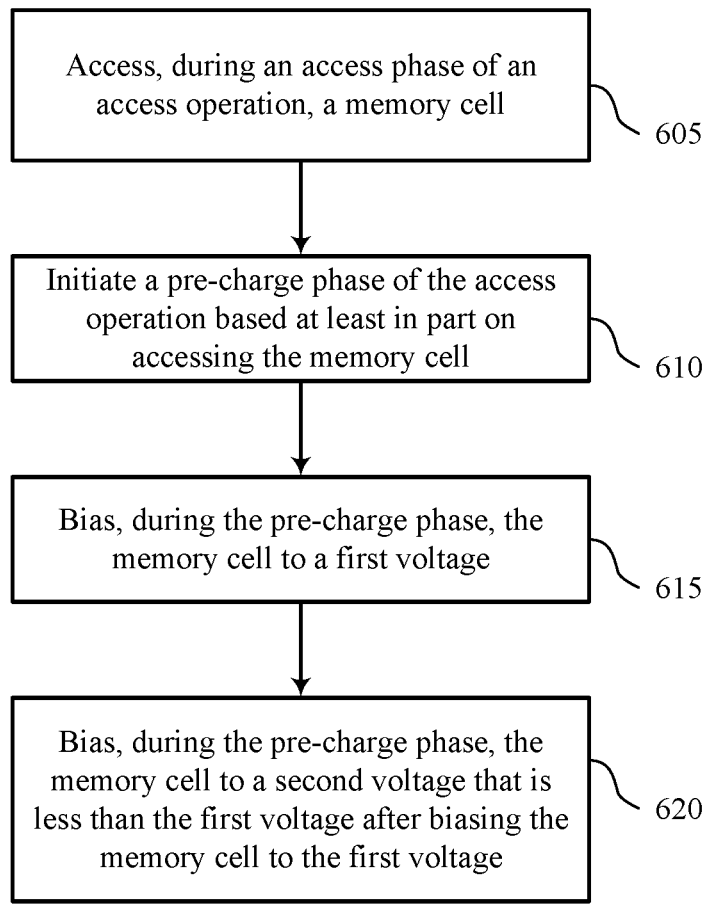
FIGS. 6 through 8 illustrate a method or methods that support memory cell biasing techniques in accordance with examples as disclosed herein.

FIG. 6 shows a flowchart illustrating a method 600 for memory cell biasing techniques in accordance with examples of the present disclosure. The operations of method 600 may be implemented by a memory controller or its components as described herein. For example, the operations of method 600 may be performed by a memory controller as described with reference to FIG. 5. In some examples, a memory controller may execute a set of codes to control the functional elements of the device to perform the functions described below. Additionally or alternatively, the memory controller may perform the functions described below using special-purpose hardware.

At 605, the memory controller may access, during an access phase of an access operation, a memory cell. The operations of 605 may be performed according to the methods described herein. In some examples, the operations of 605 may be performed by an access component as described with reference to FIG. 5.

At 610, the memory controller may initiate a pre-charge phase of the access operation based at least in part on accessing the memory cell. The operations of 610 may be performed according to the methods described herein. In some examples, the operations of 610 may be performed by a pre-charge component as described with reference to FIG. 5.

At 615, the memory controller may bias, during the pre-charge phase, the memory cell to a first voltage. The operations of 615 may be performed according to the methods described herein. In some examples, the operations of 615 may be performed by a first voltage component as described with reference to FIG. 5.

At 620, the memory controller may bias, during the pre-charge phase, the memory cell to a second voltage that is less than the first voltage after biasing the memory cell to the first voltage. The operations of 620 may be performed according to the methods described herein. In some examples, the operations of 620 may be performed by a second voltage component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for accessing, during an access phase of an access operation, a memory cell, initiating a pre-charge phase of the access operation based at least in part on accessing the memory cell, biasing, during the pre-charge phase, the memory cell to a first voltage, and biasing, during the pre-charge phase, the memory cell to a second voltage that is less than the first voltage after biasing the memory cell to the first voltage.

Some examples of the method 600 and the apparatus described herein may further include operations, features, means, or instructions for isolating the memory cell from a digit line while the memory cell is biased to the second voltage and maintaining a voltage of the memory cell at the second voltage after isolating the memory cell from the digit line.

Some examples of the method 600 and the apparatus described herein may further include operations, features, means, or instructions for identifying a state stored on the memory cell based at least in part on accessing the memory cell, wherein a value of the second voltage is based at least in part on the state of the memory cell.

Some examples of the method 600 and the apparatus described herein may further include operations, features, means, or instructions for identifying a state associated with the memory cell during the access operation and identifying a value of the second voltage based at least in part on the state associated with the memory cell during the access operation, wherein biasing the memory cell to the second voltage is based at least in part on identifying the value of the second voltage.

Some examples of the method 600 and the apparatus described herein may further include operations, features, means, or instructions for receiving, from a host device, an access command to perform the access operation on the memory cell, wherein accessing the memory cell is based at least in part on receiving the access command.

Some examples of the method 600 and the apparatus described herein may further include operations, features, means, or instructions for accessing, after the access operation and during a second access phase of a second access operation, the memory cell, initiating a second pre-charge phase of the second access operation based at least in part on accessing the memory cell, biasing, during the second pre-charge phase, the memory cell to a third voltage that is less than the first voltage, and biasing, during the second pre-charge phase, the memory cell to a fourth voltage that is less than the second voltage after biasing the memory cell to the third voltage.

Some examples of the method 600 and the apparatus described herein may further include operations, features, means, or instructions for activating a row of memory cells comprising the memory cell based at least in part on an open-page access operation and deactivating a row of memory cells comprising the memory cell based at least in part on a close-page access operation.

In some examples of the method 600 and the apparatus described herein, the access operation includes a read operation. In some examples of the method 600 and the apparatus described herein, the access operation includes a write operation. In some examples of the method 600 and the apparatus described herein, the second voltage may be a non-zero voltage. In some examples of the method 600 and the apparatus described herein, the memory cell includes a ferroelectric memory cell.

Figure 7:
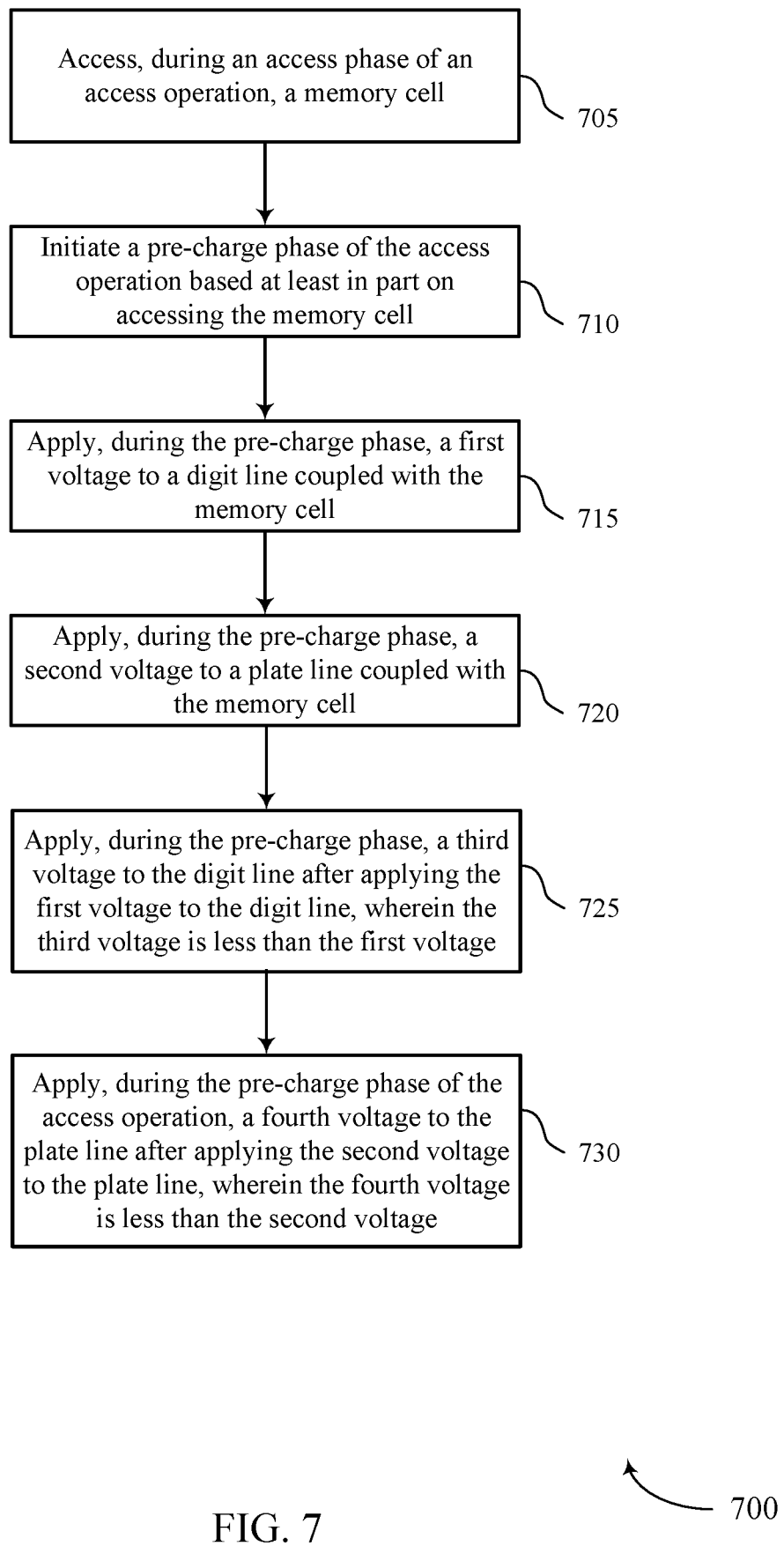

FIG. 7 shows a flowchart illustrating a method 700 for memory cell biasing techniques in accordance with examples of the present disclosure. The operations of method 700 may be implemented by a memory controller or its components as described herein. For example, the operations of method 700 may be performed by a memory controller as described with reference to FIG. 5. In some examples, a memory controller may execute a set of codes to control the functional elements of the device to perform the functions described below. Additionally or alternatively, the memory controller may perform the functions described below using special-purpose hardware.

At 705, the memory controller may access, during an access phase of an access operation, a memory cell. The operations of 705 may be performed according to the methods described herein. In some examples, the operations of 705 may be performed by an access component as described with reference to FIG. 5.

At 710, the memory controller may initiate a pre-charge phase of the access operation based at least in part on accessing the memory cell. The operations of 710 may be performed according to the methods described herein. In some examples, the operations of 710 may be performed by a pre-charge component as described with reference to FIG. 5.

At 715, the memory controller may apply, during the pre-charge phase, a first voltage to a digit line coupled with the memory cell. The operations of 715 may be performed according to the methods described herein. In some examples, the operations of 715 may be performed by a first voltage component as described with reference to FIG. 5.

At 720, the memory controller may apply, during the pre-charge phase, a second voltage to a plate line coupled with the memory cell. The operations of 720 may be performed according to the methods described herein. In some examples, the operations of 720 may be performed by a second voltage component as described with reference to FIG. 5.

At 725, the memory controller may apply, during the pre-charge phase, a third voltage to the digit line after applying the first voltage to the digit line, wherein the third voltage is less than the first voltage. The operations of 725 may be performed according to the methods described herein. In some examples, the operations of 725 may be performed by a third voltage component as described with reference to FIG. 5.

At 730, the memory controller may apply, during the pre-charge phase of the access operation, a fourth voltage to the plate line after applying the second voltage to the plate line, wherein the fourth voltage is less than the second voltage. The operations of 730 may be performed according to the methods described herein. In some examples, the operations of 730 may be performed by a fourth voltage component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for accessing, during an access phase of an access operation, a memory cell, initiating a pre-charge phase of the access operation based at least in part on accessing the memory cell, applying, during the pre-charge phase, a first voltage to a digit line coupled with the memory cell, applying, during the pre-charge phase, a second voltage to a plate line coupled with the memory cell, applying, during the pre-charge phase, a third voltage to the digit line after applying the first voltage to the digit line, wherein the third voltage is less than the first voltage, and applying, during the pre-charge phase of the access operation, a fourth voltage to the plate line after applying the second voltage to the plate line, wherein the fourth voltage is less than the second voltage.

Some examples of the method 700 and the apparatus described herein may further include operations, features, means, or instructions for isolating the memory cell from the digit line while the third voltage is applied to the digit line and the fourth voltage is applied to the plate line. Some examples of the method 700 and the apparatus described herein may further include operations, features, means, or instructions for biasing the plate line and the digit line to a zero voltage after isolating the memory cell from the digit line.

Some examples of the method 700 and the apparatus described herein may further include operations, features, means, or instructions for identifying a state stored in the memory cell based at least in part on accessing the memory cell, wherein a value of the third voltage is based at least in part on the state of the memory cell. Some examples of the method 700 and the apparatus described herein may further include operations, features, means, or instructions for applying a voltage to a word line coupled with the memory cell during the access phase of the access operation, wherein accessing the memory cell is based at least in part on applying the voltage to the word line.

In some examples of the method 700 and the apparatus described herein, the third voltage applied to the digit line may be less than the fourth voltage applied to the plate line. In some examples of the method 700 and the apparatus described herein, the third voltage applied to the digit line may be greater than the fourth voltage applied to the plate line. In some examples of the method 700 and the apparatus described herein, the memory cell includes a ferroelectric memory cell.

Figure 8:
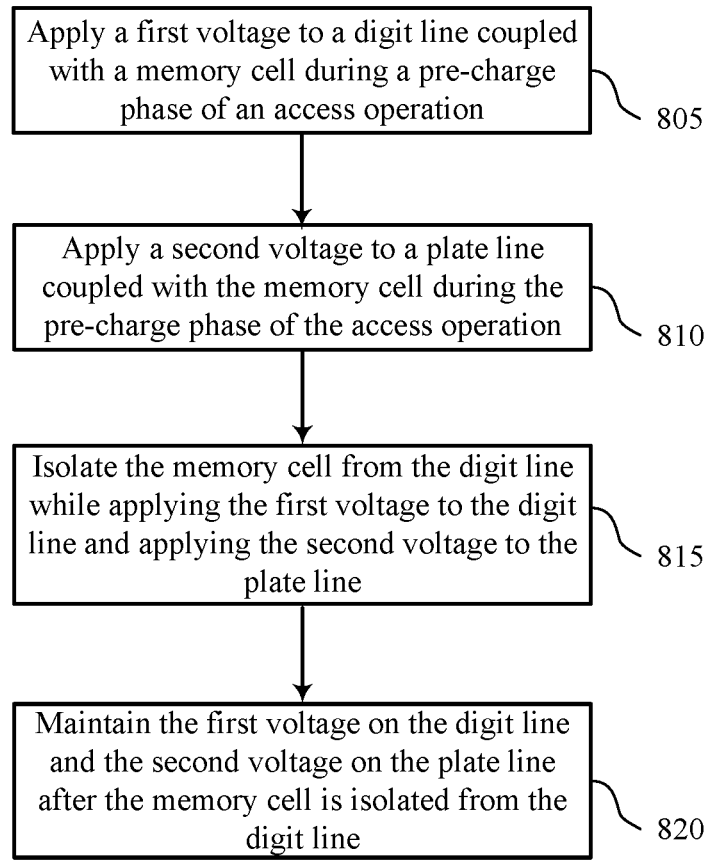

FIG. 8 shows a flowchart illustrating a method 800 for memory cell biasing techniques in accordance with examples of the present disclosure. The operations of method 800 may be implemented by a memory controller or its components as described herein. For example, the operations of method 800 may be performed by a memory controller as described with reference to FIG. 5. In some examples, a memory controller may execute a set of codes to control the functional elements of the device to perform the functions described below. Additionally or alternatively, the memory controller may perform the functions described below using special-purpose hardware.

At 805, the memory controller may apply a first voltage to a digit line coupled with a memory cell during a pre-charge phase of an access operation. The operations of 805 may be performed according to the methods described herein. In some examples, the operations of 805 may be performed by a first voltage component as described with reference to FIG. 5.

At 810, the memory controller may apply a second voltage to a plate line coupled with the memory cell during the pre-charge phase of the access operation. The operations of 810 may be performed according to the methods described herein. In some examples, the operations of 810 may be performed by a second voltage component as described with reference to FIG. 5.

At 815, the memory controller may isolate the memory cell from the digit line while applying the first voltage to the digit line and applying the second voltage to the plate line. The operations of 815 may be performed according to the methods described herein. In some examples, the operations of 815 may be performed by an isolation component as described with reference to FIG. 5.

At 820, the memory controller may maintain the first voltage on the digit line and the second voltage on the plate line after the memory cell is isolated from the digit line. The operations of 820 may be performed according to the methods described herein. In some examples, the operations of 820 may be performed by a timing voltage component as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for applying a first voltage to a digit line coupled with a memory cell during a pre-charge phase of an access operation, applying a second voltage to a plate line coupled with the memory cell during the pre-charge phase of the access operation, isolating the memory cell from the digit line while applying the first voltage to the digit line and applying the second voltage to the plate line, and maintaining the first voltage on the digit line and the second voltage on the plate line after the memory cell is isolated from the digit line.

Some examples of the method 800 and the apparatus described herein may further include operations, features, means, or instructions for identifying a state associated with the memory cell during the access operation and identifying a value of the first voltage applied to the digit line based at least in part on identifying the state.

Some examples of the method 800 and the apparatus described herein may further include operations, features, means, or instructions for identifying a state associated with the memory cell during the access operation, wherein a polarity of a voltage applied to the memory cell is based at least in part on identifying the state of the memory cell.

In some examples of the method 800 and the apparatus described herein, the value of the first voltage may be less than a value of the second voltage applied to the plate line when the state may be a first state; or, and the value of the first voltage may be greater than the value of the second voltage when the state may be a second state. In some examples of the method 800 and the apparatus described herein, the first voltage may be different than the second voltage. In some examples of the method 800 and the apparatus described herein, the memory cell includes a ferroelectric memory cell.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" or "isolating" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   initiating a pre-charge phase of an access operation based at least in part on accessing a memory cell;
   biasing, during the pre-charge phase, an access line of the memory cell to a first voltage; and
   biasing, during the pre-charge phase, the access line of the memory cell to a second voltage based at least in part on biasing the access line of the memory cell to the first voltage, wherein the second voltage comprises a non-zero voltage and wherein the access line comprises a plate line.

2. The method of claim 1, further comprising:
   applying the first voltage to the access line after initiating the pre-charge phase, wherein biasing the access line to the first voltage is based at least in part on applying the first voltage.

3. The method of claim 1, further comprising:
   applying the second voltage to the access line after biasing the access line of the memory cell to the first voltage, wherein the second voltage is different than the first voltage.

4. The method of claim 1, further comprising:
   accessing, during an access phase of the access operation, the memory cell prior to initiating the pre-charge phase of the access operation.

5. The method of claim 1, wherein the second voltage is less than the first voltage.

6. A method, comprising:

initiating a pre-charge phase of an access operation;

applying, during the pre-charge phase, a first voltage to a first access line coupled with a memory cell;

applying, during the pre-charge phase, a second voltage to a second access line coupled with the memory cell, wherein the second voltage comprises a non-zero voltage;

applying, during the pre-charge phase, a third voltage to the first access line based at least in part on applying the first voltage to the first access line; and applying, during the pre-charge phase, a fourth voltage to the second access line based at least in part on applying the second voltage to the second access line, wherein the first access line comprises a digit line and the second access line comprises a plate line.

7. The method of claim 6, further comprising:

biasing the first access line to the third voltage after applying the first voltage, wherein the third voltage is different than the first voltage.

8. The method of claim 6, further comprising:

biasing the second access line to the fourth voltage after applying the second voltage, wherein the fourth voltage is different than the second voltage.

9. The method of claim 6, further comprising:

accessing, during an access phase of the access operation, the memory cell, wherein initiating the pre-charge phase is based at least in part on accessing the memory cell.

10. The method of claim 6, wherein the third voltage is less than the first voltage.

11. The method of claim 6, wherein the fourth voltage is less than the second voltage.

12. A method, comprising:

applying a first voltage to a first access line coupled with a memory cell during a pre-charge phase;

applying a second voltage to a second access line coupled with the memory cell during the pre-charge phase;

isolating the memory cell based at least in part on applying the first voltage to the first access line and applying the second voltage to the second access line; and maintaining the second voltage on the second access line at a non-zero voltage based at least in part on isolating the memory cell, wherein the second voltage is less than the first voltage.

13. The method of claim 12, further comprising:

deactivating a switching component of the memory cell while applying the first voltage to the first access line and applying the second voltage to the second access line.

14. The method of claim 13, wherein the memory cell is isolated from the first access line based at least in part on deactivating the switching component.

15. The method of claim 12, further comprising:

maintaining the first voltage on the first access line while maintaining the second voltage on the second access line at the non-zero voltage.

16. The method of claim 15, wherein maintaining the first voltage on the first access line and the second voltage on the second access line occurs after or while isolating the memory cell.

17. The method of claim 12, wherein the first access line comprises a digit line and the second access line comprises a plate line.

18. The method of claim 12, wherein the second voltage is the non-zero voltage.

* * * * *